(12) United States Patent
Forrest et al.

(10) Patent No.: US 8,574,934 B2
(45) Date of Patent: Nov. 5, 2013

(54) OVJP PATTERNING OF ELECTRONIC DEVICES

(75) Inventors: Stephen Forrest, Ann Arbor, MI (US); Gregory McGraw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/235,943

(22) Filed: Sep. 19, 2011

(65) Prior Publication Data

US 2013/0071959 A1 Mar. 21, 2013

(51) Int. Cl.
*H01L 21/00* (2006.01)

(52) U.S. Cl.
USPC ............................................. 438/23; 438/22

(58) Field of Classification Search
USPC ........... 438/22, 28, 29, 46; 257/918; 430/311; 345/46, 55, 76, 77, 82, 83; 313/483, 313/484, 498, 503, 504; 445/1, 23, 24
See application file for complete search history.

(56) References Cited

U.S. PATENT DOCUMENTS

| | | | |
|---|---|---|---|
| 5,736,754 A * | 4/1998 | Shi et al. | ......................... 257/89 |
| 6,111,356 A * | 8/2000 | Roitman et al. | .............. 313/506 |
| 7,098,060 B2 | 8/2006 | Yu et al. | |
| 7,226,799 B2 | 6/2007 | Yu et al. | |
| 7,615,179 B2 | 11/2009 | Dumond et al. | |
| 7,663,299 B2 | 2/2010 | Chao et al. | |
| 7,719,499 B2 * | 5/2010 | Yu et al. | ........................... 345/83 |
| 7,897,210 B2 | 3/2011 | Shtein et al. | |
| 2006/0208630 A1 * | 9/2006 | Roman et al. | ................. 313/503 |
| 2007/0040493 A1 * | 2/2007 | Sellars et al. | ................. 313/504 |
| 2009/0072713 A1 * | 3/2009 | Sant et al. | ..................... 313/504 |
| 2011/0180826 A1 | 7/2011 | Morito et al. | |

FOREIGN PATENT DOCUMENTS

KR 20050043929 A 5/2005

OTHER PUBLICATIONS

Ling, M. M., Bao, Z. "Thin film deposition, patterning, and printing in organic thin film transistors" Chem. Mater. 2004, 16, 4824-4840.*
International Search Report for application No. PCT/US2012/055742, dated Feb. 1, 2013, 4 pages.

* cited by examiner

*Primary Examiner* — Charles Garber
*Assistant Examiner* — Brigitte Paterson
(74) *Attorney, Agent, or Firm* — Reising Ethington P.C.

(57) ABSTRACT

A method for forming an electronic device such as a passive color OLED display. Bottom electrodes are patterned onto a substrate in rows. Raised posts formed by photoresist are patterned into columns oriented orthogonally to the bottom row electrodes. One or more organic layers, such as R, G, B organic emissive layers are patterned over the raised posts and bottom electrodes using organic vapor jet printing (OVJP). An upper electrode layer is applied over the entire device and forms electrically isolated columnar electrodes due to discontinuities in the upper electrode layer created by the raised columnar posts. This permits patterning of the upper electrodes over the organic layers without using photolithography. A device formed by this method is also described.

11 Claims, 3 Drawing Sheets

(a)
(b)

(a)
(b)

OVJP PATTERNING OF ELECTRONIC DEVICES

TECHNICAL FIELD

The invention relates to organic thin film electronic devices and to techniques for patterning features on top of organic thin films.

BACKGROUND OF THE INVENTION

Organic thin film electronic devices include such things as transistor circuits, light emitting devices (e.g., OLEDs), and photo-responsive devices such as photodetectors. Typically, these devices contain one or more organic material layers positioned between electrically-conductive electrodes used to activate or read the device. Patterning of electrodes or other features over top an organic thin film is often carried out using photolithography which can be problematic in electronic device fabrication. Most organic semiconductor materials are chemically incompatible with standard photolithographic techniques.

In such devices the active organic semiconductor layer typically must be laterally patterned to define the device area. Many patterning techniques have been developed to address the unique requirements of organic semiconductors. Inkjet printing, nozzle printing, thermal vapor jet printing, and organic vapor jet printing (OVJP) are four such directed stream printing technologies for organic semiconductors and are described below.

Inkjet printing technology is based on direct patterning of substrates using solutions or inks of organic semiconductors which are pre-dissolved in solvents. The method essentially involves the ejection of a fixed quantity of an ink from a nozzle to the substrate under piezoelectric action. The ejected drop falls under the action of gravity and air resistance until it impinges on the substrate at a pre-defined well structure. The drop is then dried to remove solvent leaving the organic semiconductor in the pre-defined well forming pixel pattern. IJP technology has the potential to deliver cost-effective, large area printing of organic electronic materials with high material utilization.

Nozzle printing is also a solution (solvent-solute combination) based technology. Nozzle printing consists of a continuous extrusion of solution through a small diameter nozzle which moves at high speed to print pixel pattern. High throughput, good pixel uniformity, and material utilization make this technique attractive and cost-effective for printing organic semiconductors.

Most consumer inkjet printers are based on thermal vapor jet printing technology. This method of printing consists of rapid vaporization of inks to form a bubble by passing a pulse of current through a heating element placed in a tiny chamber of the print cartridge. Bubble formation causes a large pressure increase which propels a droplet of ink onto the substrate. The inks used in this technique are usually water-based (aqueous) and pigments or dyes are used as colorants. Print heads used in thermal vapor jet printing are cheaper to produce than print heads used in conventional inkjet technique.

Organic vapor jet printing (OVJP) enables the direct, high resolution, and rapid printing of molecular organic semiconductor devices on a variety of substrates. In this technique, organic molecules are sublimated into a hot, inert carrier gas and expanded through microscopic nozzles forming a highly collimated gas jet. The gas jet impinges on a cooled substrate to form a well-defined thin film of organic molecules whose lateral extent is governed by the nozzle diameter, nozzle-to-substrate distance, and the downstream ambient pressure. Thus, direct patterning of organic electronic materials is possible using OVJP technique which is solvent-free (compare inkjet printing and nozzle printing techniques) and has the potential to be cost-effective.

SUMMARY OF THE INVENTION

According to one aspect of the invention, there is provided a method of forming an electronic device using directed stream printing. The method includes the steps of: (a) patterning at least one layer of material on a substrate using photolithography, thereby forming a first intermediate device structure; (b) patterning an organic material on the first intermediate device structure using directed stream printing, thereby forming a second intermediate device structure; and thereafter (c) completing the electronic device in one or more subsequent steps, wherein at least one of the steps includes applying at least one further material to the second intermediate device structure, and wherein the one or more subsequent steps are carried out without using photolithography.

In accordance with another aspect of the invention, there is provided a method of forming an electronic device that includes the steps of: (a) patterning onto a substrate a plurality of bottom electrodes that are electrically isolated from each other; (b) patterning a plurality of raised posts that each extend across at least some of the bottom electrodes, wherein the plurality of raised posts define upper electrode channels between adjacent pairs of the raised posts; (c) applying an organic material over at least portions of the bottom electrodes using organic vapor jet printing; and (d) applying a layer of electrode material over the raised posts and into the upper electrode channels, wherein the raised posts create discontinuities in the layer of electrode material, thereby creating isolated upper electrodes in each of the electrode channels.

BRIEF DESCRIPTION OF THE DRAWINGS

Preferred exemplary embodiments of the invention will hereinafter be described in conjunction with the appended drawings, wherein like designations denote like elements, and wherein:

FIG. 1 includes parts (a) and (b) wherein FIG. 1(a) is a diagrammatic top view of an OLED passive matrix display constructed in accordance with an embodiment of the invention, and FIG. 1(b) is a diagrammatic cross-sectional view taken along the b-b line of FIG. 1(a);

DETAILED DESCRIPTION OF THE ILLUSTRATED EMBODIMENT

Figure 1:
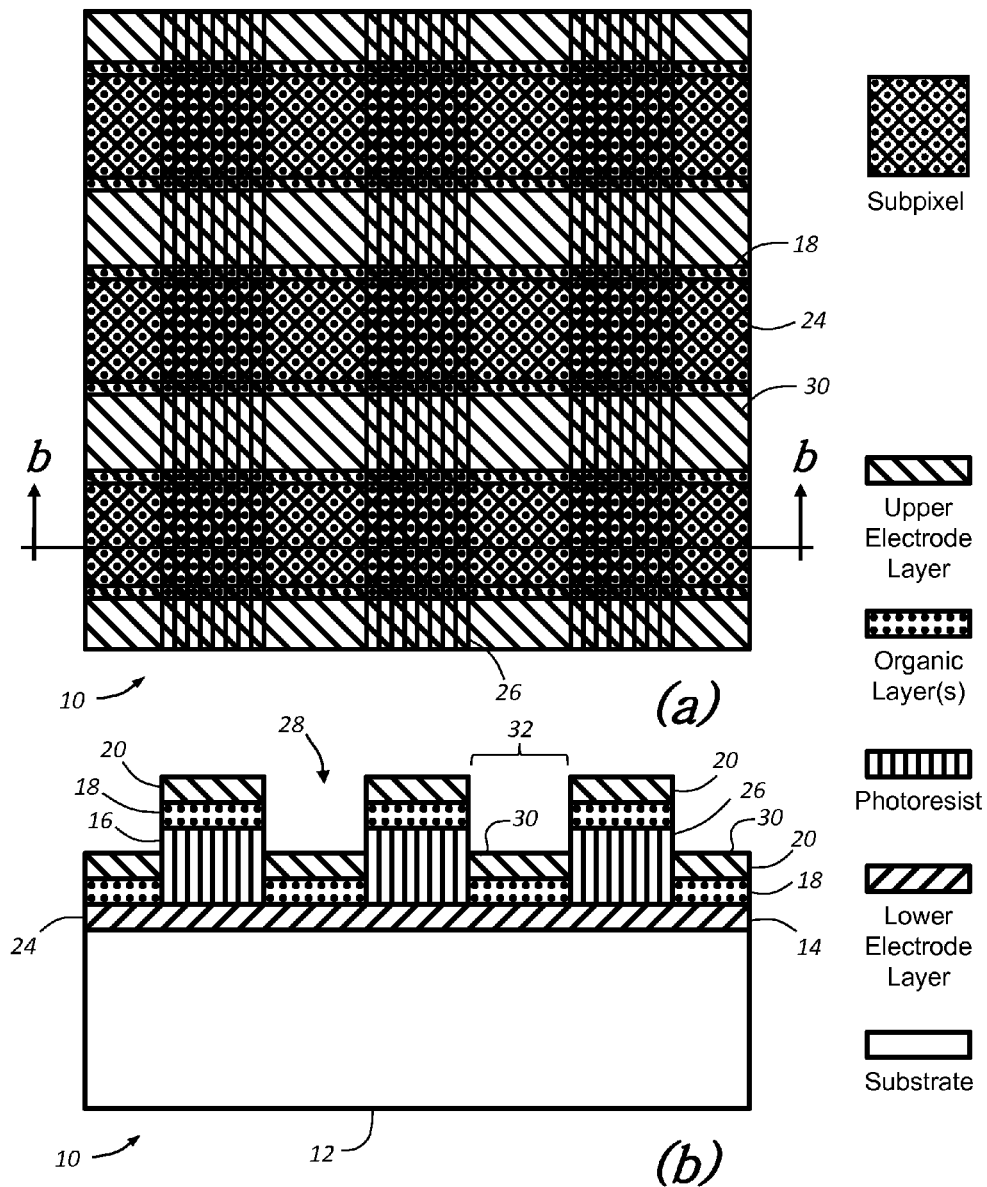

Referring to FIG. 1, there is shown an electronic device 10 in the form of a passive matrix OLED color display having individually addressable subpixels. As will be described below, the structure shown is produced by a process that permits a patterned upper electrode layer to be formed after directed stream printing of one or more organic layers without the need for using photolithography to form the upper electrodes. These and other features and advantages of the illustrated electronic device will be described below. Although any suitable directed stream printing technology (e.g., inkjet printing, nozzle printing, thermal vapor jet printing, or OVJP) can be used to pattern or otherwise apply the one or more organic layers, the following discussion and illustrated embodiment is discussed as it may be implemented using OVJP. Furthermore, apart from passive matrix OLEDs (PMOLEDs) and active matrix OLEDs (AMOLEDs), various other types of electronic devices such as circuits, transistors, and other devices can be fabricated using the techniques described herein.

In the figures, various cross hatching is used to identify the various materials and layers as indicated on the legend. It will be appreciated by those skilled in the art that the illustrated display 10 depicts but a small region of a typical display and is greatly enlarged relative to a typical OLED pixel size. In practice, the display 10 may have any one of a wide range of pixel dimensions as needed or desirable for a particular application. Also, as the description proceeds, it will be apparent that the figures depict the more fundamental elements of the illustrated display 10, and that, in practice, the display may include additional layers, components, or other features, some of which are described below and at least some of which will be known by those skilled in the art.

As shown, display 10 includes a substrate 12, lower electrode layer 14, photoresist 16, one or more organic material layers 18, and an upper electrode layer 20. Substrate 12 may be any suitable material, for example, glass or a polyethylene such as PET. Lower electrode layer 14 may comprise any suitable electrode material, for example, indium tin oxide (ITO) which can be used as a transparent conductive electrode material. When used with a glass or other transparent substrate, this permits the display 10 to be implemented as a bottom emission display in which the light output from the organic material layer 18 radiates out through the lower electrode and substrate. Alternatively, a top emission display can be made by using ITO or other suitably-transparent top electrode material. As yet another alternative, top and bottom transparent electrodes may be used to manufacture a transparent OLED (TOLED). In other embodiments where light transmission through the electrodes is not necessary (e.g., a transistor circuit), both electrodes may be opaque.

Lower electrode layer 14 is patterned as a plurality of rows of bottom electrodes 24, three of which are shown in FIG. 1(a) and one of which is shown in FIG. 1(b). Photoresist 16 is patterned orthogonally to these rows as columnar raised posts 26 that cross the bottom electrodes and define upper electrode channels 28 between adjacent pairs of the raised posts. The organic material is applied over the bottom electrodes 24 and raised posts 26. This organic material includes at least one organic emissive layer (EML) patterned onto the device using OVJP. As shown in FIG. 1, this EML can be printed in rows that overlie the bottom electrodes 24 and that cross over the raised posts 26. As will be appreciated from FIG. 1(b), the raised posts create discontinuities in the rows of organic material that define electrically isolated subpixel sites of the organic material. Although not shown, common organic layers such as a hole transport layer (HTL), electron transport layer (ETL), electron blocking layer (EBL), or hole injection layer (HIL) can be applied over the entire device, as is known to those skilled in the art.

The upper electrode layer 20 is applied over top of the entire device, but forms electrically isolated column electrodes 30 in the electrode channels 28 that are located between the raised posts 26. Again, this occurs because the height of the raised posts 26 is sufficient to create discontinuities in the applied upper electrode layer 20. Within the upper electrode channels 28, the upper electrode layer overlies the organic material at each of the subpixel sites, thereby forming a complete subpixel 32 comprising a stack-up of the organic layer(s) 18 sandwiched between the bottom and top electrodes 24, 30. Each of these subpixels 32 is individually addressable using the proper selection of the row (bottom) and column (upper) electrodes 24, 30, respectively. Note that although the bottom electrodes 24 are referred to as row electrodes and the upper electrodes 30 as column electrodes, their nomenclatures or positions could be switched.

An advantage of this construction is that it can be manufactured using known techniques for each of the steps without requiring the use of photolithography to pattern the upper electrode after placing the organic thin film layer(s) 18. By carrying out all photolithography steps prior to patterning of the organic materials, this approach avoids the problems inherent in using conventional photolithography to pattern upper electrodes over the organic thin film. A particular method 40 of forming an electronic device such as the OLED display 10 of FIG. 1 will now be described. In general, the method involves patterning at least one layer of material on a substrate using photolithography, patterning over that an organic material using OVJP, and then completing the electronic device in one or more subsequent steps that include applying a further material to the device, wherein the additional steps used to complete the device are all carried out without using photolithography. In general terms, patterning of a material layer can be done, for example, by depositing the material in the desired pattern, or by applying a full surface coating of the material and then using photolithography to obtain the desired pattern, or in any other suitable way. Patterned depositing of material can be by printing, catalyst-based growth on a substrate, or by any other suitable means.

Figure 2:
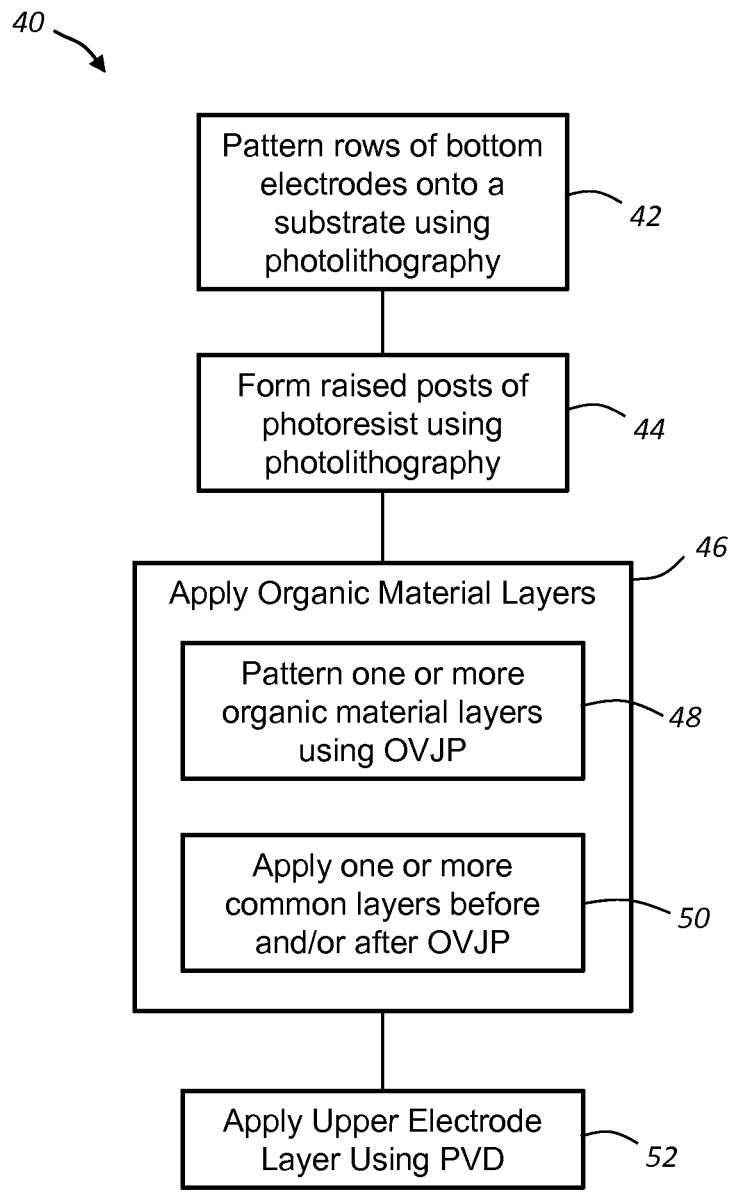
FIG. 2 is a flow chart depicting steps of a method of manufacturing an electronic device in accordance with an embodiment of the invention.
Figure 3:
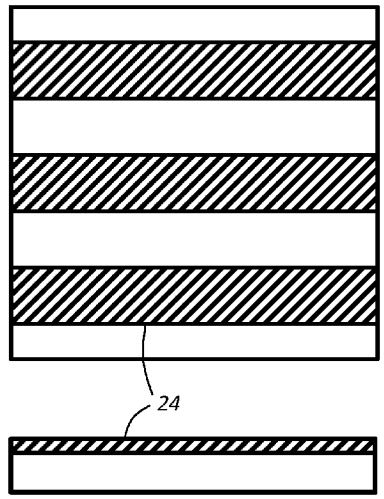
FIGS. 3-6 are each two part views as in FIG. 1 showing various stages of the FIG. 2 method of fabricating the OLED display of FIG. 1
Figure 4:
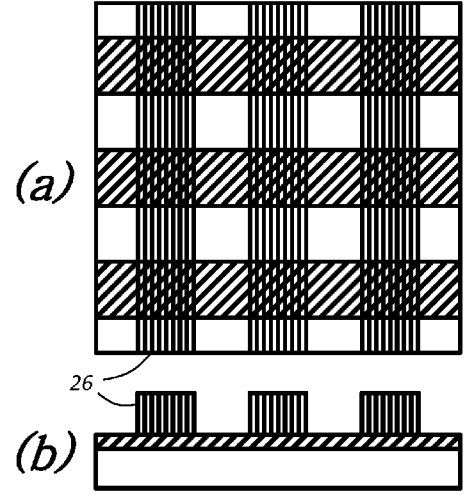

The illustrated fabrication method 40 is shown in FIG. 2 and will be described in conjunction with FIGS. 3-6 that depict various intermediate device structures as well as the completed electronic device 10. The first step 42 involves patterning rows of bottom electrodes 24 onto substrate 12 using photolithography. As shown in FIG. 3, this may be done as spaced rows of electrically conductive material that are electrically isolated from each other. The raised posts 26 are then formed over the bottom electrodes 24 using photolithography at step 44. This may be done applying photoresist over the entire device, patterning with a photomask, and then developing. In some embodiments, this is done so as to include an undercut in the raised posts to help insure the discontinuities in the organic and upper electrode layers when they are subsequently applied. Undercutting can be carried out in various ways known to those skilled in the art; for example, by overbaking the photoresist or using a bi-layer process in which the underlying layer has greater solubility in the developer relative to the upper photoresist layer. The posts 26 are then cured and outgassed, again this can be done using known techniques. FIG. 4 depicts an intermediate device structure having the raised posts applied over and running perpendicularly to the bottom electrodes 24.

Figure 5:
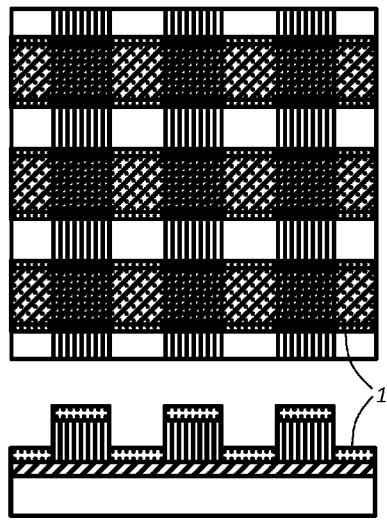

At step 46, the one or more organic material layers are applied. This is shown in FIG. 5 and includes at least step 48 of patterning of the organic EML using OVJP. As noted above, depending on the desired device structure, one or more common organic layers such as HTL, ETL, or EBL can be applied before and/or after OVJP, as indicated at step 50. As one example, a p-type HTL such as NPB or TPD can be blanket applied to the intermediate device structure of FIG. 4 prior to patterning the organic EML via OVJP, and an n-type ETL such as Alq3 or PBD can be blanket applied after OVJP. These common organic layers may be applied by vacuum thermal evaporation or other suitable method.

The organic EML itself is applied in the illustrated embodiment by OVJP in rows that overlie and are in registration with the underlying bottom electrodes 24. As shown in the figures, the rows of organic material layer (EML) 18 may be applied such that they have a width that is slightly greater than that of the bottom electrodes 24. This helps provide complete coverage of the bottom electrodes by the EML layer so that there are no conduction paths around the EML layer 18 between the bottom and top electrodes at the sides of the subpixels. Techniques and equipment for patterning using OVJP is known, see for example, U.S. Patent Application Publication No. 2010/0247766A1, the complete contents of which are hereby incorporated by reference. Subpixel size may depend on the resolution limit of the various technologies used to produce the device; for at least some embodiments of the OVJP patterning, stripe widths of the organic layer 18 can be in the range of 0.5 microns to 500 microns or more. Registration of the OVJP patterning with the underlying bottom electrodes may be done using optical or other techniques, as will be apparent to those skilled in the art. Suitable organic materials for EML 18 include fluorescent dye and phosphorescent dye. For a color display, such as shown in FIGS. 1 and 3-6, different organic materials can be patterned using OVJP, including different R, G, B materials. For example, the upper row of organic material shown in FIG. 5 can be a red emitting organic material, the middle row a blue, and the bottom row a green. In other embodiments, the different colored subpixels can be patterned in different arrangements; for example, by having two or more of the different color materials alternating along the length of a row. Other such subpixel geometric arrangements will be apparent to those skilled in the art. Also, the size of the different color subpixels can be selected as desired or necessary for a particular application so that, for example, the blue subpixels can be made larger than the green subpixels to help minimize current density through the blue subpixel, thereby increasing its service life. Similarly, the spacing between adjacent subpixels in either dimension can be controlled; for example, by reducing the width of the raised posts 26, the horizontal inter-pixel spacing can be reduced. Similarly, by patterning the bottom electrodes closer together, the vertical inter-pixel spacing can be reduced.

Figure 6:
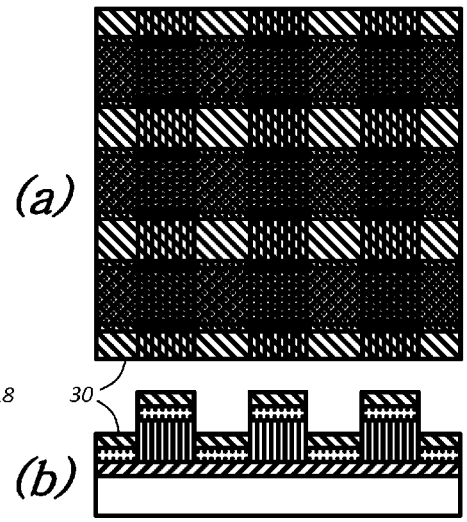

Finally, at step 52, the electronic device 10 is completed by applying the upper electrode layer. This may be done using physical vapor deposition (PVD) or other suitable technique to blanket coat the intermediate device structure of FIG. 5 with Al or other suitable electrode material. The completed device is shown in FIG. 6.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, rather than patterning the organic EML layer(s) as rows overlying the bottom electrodes, they could be disposed in columns within the upper electrode channels 28. Or, for fabricating AMOLEDs, further photoresist posts can be used to define the active portions of the device, such as by depositing and patterning the photoresist prior to the bottom electrode. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method of forming an electronic device using organic vapor jet printing, comprising the steps of:
   (a) patterning onto a substrate a plurality of bottom electrodes that are electrically isolated from each other;
   (b) patterning a plurality of raised posts that each extend across at least some of the bottom electrodes, wherein the plurality of raised posts define upper electrode channels between adjacent pairs of the raised posts;
   (c) applying rows of an organic material over at least portions of the bottom electrodes using directed stream printing so that the rows cross at least some of the raised posts; and
   (d) applying a layer of electrode material over the raised posts and into the upper electrode channels, wherein the raised posts create discontinuities in the layer of electrode material, thereby creating isolated upper electrodes in each of the electrode channels.

2. The method of claim 1, wherein step (a) comprises patterning the plurality of bottom electrodes onto the substrate in rows using photolithography.

3. The method of claim 2, wherein step (b) comprises forming the raised posts using photolithography by patterning columns of a photoresist oriented orthogonally to the rows of bottom electrodes.

4. A method of forming an electronic device using organic vapor jet printing, comprising the steps of:
   (a) patterning onto a substrate a plurality of bottom electrodes that are electrically isolated from each other;
   (b) patterning a plurality of raised posts that each extend across at least some of the bottom electrodes, wherein the plurality of raised posts define upper electrode channels between adjacent pairs of the raised posts;
   (c) applying an organic material over at least portions of the bottom electrodes using directed stream printing; and
   (d) applying a layer of electrode material over the raised posts and into the upper electrode channels, wherein the raised posts create discontinuities in the layer of electrode material, thereby creating isolated upper electrodes in each of the electrode channels;
   wherein step (a) comprises patterning the plurality of bottom electrodes onto the substrate in rows using photolithography;
   wherein step (b) comprises forming the raised posts using photolithography by patterning columns of a photoresist oriented orthogonally to the rows of bottom electrodes; and
   wherein step (c) comprises applying rows of organic material using organic vapor jet printing such that the rows of organic material overlie the bottom electrodes and cross the raised posts, wherein the raised posts create discontinuities in the rows of organic material that define electrically isolated subpixel sites of organic material.

5. The method of claim 4, wherein step (c) comprises applying different light emissive organic materials such that groups of the subpixel sites include the different light emissive organic materials that are individually addressable using the bottom and upper electrodes, whereby the electronic device comprises a matrix display.

6. The method of claim 1, wherein the organic material is an organic emissive layer and wherein step (c) further comprises applying at least one additional layer of a different organic material either before or after the organic emissive layer.

7. The method of claim 1, wherein step (d) comprises applying the layer of electrode material by physical vapor deposition.

8. The method of claim 1, wherein step (c) comprises applying the organic material using one of the following printing techniques: inkjet printing; nozzle printing; thermal vapor jet printing; or organic vapor jet printing.

9. The method of claim 4, wherein the organic material is an organic emissive layer and wherein step (c) further comprises applying at least one additional layer of a different organic material either before or after the organic emissive layer.

10. The method of claim 4, wherein step (d) comprises applying the layer of electrode material by physical vapor deposition.

11. The method of claim 4, wherein step (c) comprises applying the organic material using one of the following printing techniques: inkjet printing; nozzle printing; thermal vapor jet printing; or organic vapor jet printing.

* * * * *

UNITED STATES PATENT AND TRADEMARK OFFICE
CERTIFICATE OF CORRECTION

| | | |
|---|---|---|
| PATENT NO. | : 8,574,934 B2 | Page 1 of 1 |
| APPLICATION NO. | : 13/235943 | |
| DATED | : November 5, 2013 | |
| INVENTOR(S) | : Stephen Forrest and Gregory McGraw | |

It is certified that error appears in the above-identified patent and that said Letters Patent is hereby corrected as shown below:

Insert the following heading and paragraph immediately after the title at column 1, line 3 of the Specification:

-- JOINT RESEARCH AGREEMENT

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement. --

Signed and Sealed this
Eighteenth Day of March, 2014

Michelle K. Lee
*Deputy Director of the United States Patent and Trademark Office*